United States Patent
Bonanni et al.

(10) Patent No.: US 6,400,157 B1
(45) Date of Patent: Jun. 4, 2002

(54) MRI METHODS AND SYSTEMS

(75) Inventors: Luciano B. Bonanni, Dix Hills; Jevan Damadian, East Northport, both of NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 09/200,267

(22) Filed: Nov. 25, 1998

Related U.S. Application Data

(60) Provisional application No. 60/066,535, filed on Nov. 26, 1997.

(51) Int. Cl.[7] .................................................. G01V 3/00
(52) U.S. Cl. ........................................ 324/322; 324/309
(58) Field of Search ................................ 324/322, 318, 324/300, 307, 309, 314; 600/410, 411, 422, 423

(56) References Cited

U.S. PATENT DOCUMENTS

| | | | |
|---|---|---|---|
| 4,674,046 A | 6/1987 | Ozeki et al. | |
| 4,737,921 A | 4/1988 | Goldwasser et al. | |
| 4,875,485 A | 10/1989 | Matsutani | |
| 5,038,783 A | 8/1991 | Dumoulin | |
| 5,050,608 A | 9/1991 | Watanabe et al. | |
| 5,153,546 A | 10/1992 | Laskaris | |
| 5,211,165 A | 5/1993 | Dumouline et al. | |
| 5,239,265 A | 8/1993 | Sugahara | |
| 5,271,400 A | 12/1993 | Dumoulin et al. | |
| 5,349,296 A | 9/1994 | Cikott et al. | |
| 5,365,927 A | 11/1994 | Roemer et al. | |
| 5,431,161 A | 7/1995 | Ryals et al. | |
| 5,512,826 A | 4/1996 | Hardy et al. | |
| 5,512,827 A | 4/1996 | Hardy et al. | |
| 5,514,962 A | 5/1996 | Cline et al. | |
| 5,584,293 A | * 12/1996 | Darrow et al. | 128/653.2 |
| 5,647,361 A | 7/1997 | Damadian | |
| 6,108,573 A | * 8/2000 | Debbins et al. | 600/410 |
| 6,119,032 A | 9/2000 | Martin et al. | |
| 6,135,958 A | 10/2000 | Mikula-Curtis et al. | |
| 6,157,194 A | * 12/2000 | Vassallo et al. | 324/322 |
| 6,166,544 A | 12/2000 | Debbins et al. | |
| 6,201,394 B1 | 3/2001 | Danby et al. | 324/319 |

OTHER PUBLICATIONS

"Fonar Beta–3000M Fixed–Site Magnetic Resonance Scanner", Brochure, FONAR Corporation, pp. 6–7, 34–53 and 62–63, (1988).
"The Ultimate™ MR Machine", Brochure, FONAR Corporation, pp. 6–11, 14–15 and 20–23 (1992).

* cited by examiner

*Primary Examiner*—Louis Arana
(74) *Attorney, Agent, or Firm*—Lyon & Lyon LLP

(57) ABSTRACT

Methods for changing the values of parameters of a pulse sequence of a magnetic resonance imaging scanning procedure to change a characteristic of at least one image resulting from the scanning procedure are disclosed wherein an input device in the room with the patient is used to provide an input to the magnetic resonance imaging system. The input device is preferably a hand-operated device, such as a mouse. Values of parameters corresponding to TR time, TE time, slice axis, slice thickness, slice location, field of view, oblique angle and resolution may, for example, be changed by providing suitable inputs through the input device. Methods of conducting MRI scans are also disclosed wherein an updated pulse sequence is formed based on a current pulse sequence and an input from an input device, during execution of the current pulse sequence. MRI systems are disclosed, as well. The methods and systems are particularly suitable for use by a surgeon during a surgical procedure, to obtain magnetic resonance images in real-time or nearly in real-time.

75 Claims, 6 Drawing Sheets

MRI METHODS AND SYSTEMS

This application claims the benefit of U.S. Provisional Application No. 60/066,535, which was filed on Nov. 26, 1997 and is incorporated by reference herein.

FIELD OF THE INVENTION

The present invention relates to methods and systems for conducting magnetic resonance imaging and, more particularly, to the control of the individual parameters of a pulse sequence controlling a magnetic resonance imaging scanning sequence by medical personnel within an operating room during surgery.

BACKGROUND OF THE INVENTION

Magnetic resonance imaging ("MRI") is a well known, highly useful technique for diagnosing abnormalities in biological tissue. MRI can detect abnormalities which are difficult or impossible to detect by other techniques, without the use of x-rays or invasive procedures.

Magnetic resonance imaging uses changes in the angular momentum or spin of the atomic nuclei of certain elements within body tissue in a static magnetic field after excitation by radio frequency energy, to derive images containing useful information concerning the condition of the tissue. During a magnetic resonance imaging procedure, the patient is inserted into an imaging volume of a magnet which generates a static magnetic field. Gradient coils are provided within the imaging volume to generate time-varying, linear magnetic fields along the x, y, z axis within the imaging volume, as well. Within the imaging volume, the vector of the angular momentum or spin of nuclei of elements containing an odd number of protons or neutrons tends to align with the direction of the magnetic field. The spins of the nuclei are referred to as the "spin system".

Exciting the spin system of the tissue within the imaging volume by radio frequency energy at the resonant or Larmor frequency shifts the spin system out of alignment with the applied magnetic field and into phase with each other. The spins of the nuclei then turn or "precess" around the direction of the applied primary magnetic field. As their spins precess, the nuclei emit small radio frequency signals, referred to as magnetic resonance ("MR") signals, at the resonant or Larmor frequency, which are detected by a radio frequency antenna tuned to that frequency. The gradient magnetic fields applied during the pulse sequence spatially encode the MR signals emitted by the nuclei. After the cessation of the application of radio frequency waves, the precessing spins gradually drift out of phase with one another and back into alignment with the direction of the applied magnetic field. This causes the MR signals emitted by the nuclei to decay. The MR signals are detected by a radio frequency receiving antenna positioned within the imaging volume proximate the patient and are amplified, digitized and processed by the MRI system. Hydrogen is the most commonly detected element because it is the most abundant nuclei in the human body and emits the strongest MR signal.

The rate of decay or relaxation of the MR signals varies for different types of tissue, including injured or diseased tissue, such as cancerous tissue. By known mathematical techniques involving correlation of the gradient magnetic fields and the particular frequency of the radio frequency waves applied at various times with the decay rate of the MR signals emitted by the patient, the environment, as well as the concentrations, of the nuclei of interest at various locations within the patient's body may be determined. This information is typically displayed as an image with varying intensities which are a function of the concentration and environment of the nuclei of interest.

A magnetic resonance imaging procedure typically comprises one or more image scanning sequences, each of which comprises a precisely timed and orchestrated series of pulses of radio-frequency energy, and variation of the three orthogonal magnetic field gradients and the data sampling window. Each scanning sequence is defined by a pulse sequence, which is a series of values for parameters corresponding to particular characteristics of the scanning sequence and the resulting MR images. An image is derived from many repetitions of the pulse sequence, where small changes are typically introduced in the phase encoding gradient of the pulse sequence parameters between repetitions to provide additional spatial encoding. Other changes to the pulse sequences may be introduced, as well.

The relaxation rate of the MR signals has two components which are responsible for the contrast in intensities in MR images, $T_1$, or the spin-lattice relaxation time, and $T_2$, or the spin-spin relaxation time. $T_1$, is a function of the rate at which the radio frequency energy absorbed by the nuclei to cause the shift of the spin system is dissipated as the magnitude of the magnetization vector of the spin system returns to its original alignment with the magnetic field. $T_2$ is a measure of the dephasing or loss of phase coherence of the spin system. The relaxation times $T_1$, $T_2$ are inherent characteristics of the particular sample being irradiated.

Since different types of tissue have different relaxation times, the degree $T_1$ and $T_2$ contribute to an image, and hence the image contrast, can be altered by timing parameters of the pulse sequence. TR is the repetition time of the pulse sequence. TR varies the contribution of $T_1$ of different tissue types to the image. Another timing parameter, TE, referred to as the echo time, is the time interval between injecting a radio frequency pulse and the appearance of a spin echo MR signal, which affects the contribution of $T_2$ to the image. The TR and TE timing parameters of the pulse sequence are executed by an NMR controller of the MRI system. Scanning at short TR and TE times enables faster image acquisition than scanning at long TR and TE values. It has been found that short TR and TE times yield images with better anatomical detail than images taken at longer TR/TE times, while longer TR and TE times yield images with the better contrast information than shorter TR/TE times. Better contrast information may result in better detail for diagnostic purposes. Abnormal tissue, such as diseased or cancerous tissue, is more readily identified on images taken at longer TR and TE times.

Other characteristics of the MR image controlled by the values of parameters of the pulse sequence include the orthogonal alignment of the slice axis of the image in the sagittal, axial or coronal axis of the patient, the oblique angle of the scan through the region of interest of the patient, the field of view of the image and the position of the slice.

The orthogonal alignment of the slice axis of the image is determined by the orientation of the slice select gradient field with respect to the x-y-z axis. The orientation of the slice axis of the image gradient field is controlled by a gradient controller in the MRI system. The oblique angle of the scan is varied by suitably controlling the gradient magnetic fields to define a gradient plane of constant magnetic field at the desired angle. See, for example, U.S. Pat. No. 4,871,966, assigned to the assignee of the present invention and incorporated by reference herein.

The field of view of the image is determined by the magnitudes of the gradient fields, which are also controlled by the gradient controller, and the sampling period, which is controlled by the NMR controller.

The slice position is determined by the center frequency of the radio frequency pulse, which is controlled by the NMR controller. The thickness of the slice is determined by the bandwidth of the radio frequency pulse and the magnitudes of the gradient fields, which are controlled by the NMR controller and the gradient controller, respectively.

Typically, the MRI system is controlled by a MR technologist outside the room containing the system and patient. The technologist sits at a console with a monitor and uses a mouse or keyboard to click on or type in a limited set of options in a menu driven program. The technologist may select a particular predetermined pulse sequence or may select values for particular parameters of the pulse sequence from a list, based on the portion of the body to be scanned and the instructions of a doctor. When one scanning sequence or series of scanning sequences is completed, the technologist can enter a pulse sequence for another scanning sequence which can then be initiated.

MRI can be of great benefit during a surgical procedure to locate diseased tissue and to provide current images of the site of the procedure to the surgeon. Presently, however, MRI has been used predominantly for pre-operative and postoperative imaging. MRI has had limited surgical use including MRI-guided fine-needle aspiration cytology and MRI-guided stereotactic neurosurgery. MRI can also be used to follow and guide the advance of instruments, such as catheters, to a site of interest. See, for example, U.S. Pat. No. 5,647,361, assigned to the assignee of the present invention.

MRI systems are available with imaging volumes large enough to conduct surgery. The magnet of the MRI system may be large enough to contain an entire surgical team. U.S. Ser. No. 07/993,072, filed on Dec. 18, 1992, assigned to the assignee of the present invention and incorporated by reference herein, discloses such open MRI systems for conducting surgery. The Quad 7000 and 1200 open MRI systems available from the FONAR Corporation, Melville, N.Y., are suitable for performing surgery and other medical procedures, as well.

However, it can take many minutes for a technologist to set up a scanning sequence. If used during surgery, the surgeon must communicate with the technician in a separate room to request a particular scanning sequence. The surgeon must then wait for the scanning sequence to be set up by the technologist, conducted and processed to yield an image. This can be a time-consuming, inefficient process. Many minutes may elapse before the surgeon has the needed image.

SUMMARY OF THE INVENTION

Methods are disclosed for changing one or more parameters of a pulse sequence to change a characteristic of at least one image resulting from the scanning procedure. Methods and systems are also disclosed for conducting magnetic resonance imaging, wherein values of one or more parameters of a pulse sequence are changed.

In accordance with one aspect of the present invention, a method for changing the parameters of a pulse sequence of a magnetic resonance imaging scan to change a characteristic of at least one image resulting from the scan includes providing an input device in the room where the patient is located. An input is provided to the magnetic resonance imaging system through the control device to cause a change in a particular parameter of the pulse sequence. Parameters of the pulse sequence may thereby be updated, as desired, by someone in the room with the patient. The input device is preferably a mouse with control buttons and a mouse pad. Clicking the control buttons and moving the mouse causes changes in particular parameters of the pulse sequence. Other input devices which maybe used include a joystick with buttons, a track ball, a touchpad and a keypad.

In the preferred embodiment, the mouse can cause the computer controlling the MRI system to enter modes of operation to control different parameters of the pulse sequence. The multiple modes of operation increase the functionality of the mouse or other such input device. For example, the mouse may have three control buttons and a rollerball. Double-clicking the first button may put the system into a first mode, wherein the values of TR and TE, and the slice axis, may be varied. Double-clicking the second button may put the system into a second mode, wherein the position of the slice, the thickness of the slice and the field of view may be varied. Double-clicking the third button may put the system into a third mode, wherein the angle of the image slice can be rotated and the resolution of the image may be varied. Once the system is in a particular mode, clicking particular buttons and/or moving the mouse causes a change in the values of particular parameters of the pulse sequence controlled in that mode.

In another aspect of the invention, a method of conducting MRI is disclosed wherein a second pulse sequence is formed based on a first pulse sequence. At least one value of a parameter of the first pulse sequence is updated in the second pulse sequence in response to an input. The second pulse sequence with the updated parameter value or values is formed while a first scanning sequence in accordance with the first pulse sequence is being implemented. Preferably, after preparation of the second pulse sequence, the first scanning sequence is interrupted and a second scanning sequence implemented in accordance with the second pulse sequence. Alternatively, the second scanning sequence can be implemented after the first sequence is completed. In either case, MRI scanning can proceed continuously.

An MRI system is also disclosed in accordance with the present invention wherein an updated pulse sequence is based on a current pulse sequence and has at least one updated value of a parameter of the current pulse sequence, as determined by an input by an input device. The updated pulse sequence is formed during execution of the current pulse sequence. Preferably, the current pulse sequence is then interrupted and a second scanning sequence is executed based on the updated pulse sequence. Interruption of the current pulse sequence and execution of the updated pulse sequence may take place immediately after formation of the updated pulse sequence.

An MRI system is also disclosed including an input device disposed in a room including the imaging volume and the patient, for providing signals to the MRI system to cause a change in the value of at least one parameter of the pulse sequence.

The present invention enables the direct control of the most useful parameters of a pulse sequence, and hence the most significant characteristics of the MR image, quickly and easily. The invention may be used by a surgeon or other medical personnel at or near the bedside of the patient before, during and after a surgical procedure to obtain the desired images, without interacting with the MR technologist or being restrained by predetermined pulse sequences. The MR technologist or other such personnel can also use the present invention to rapidly and directly vary the parameters of a pulse sequence.

DETAILED DESCRIPTION OF THE INVENTION

Figure 1:
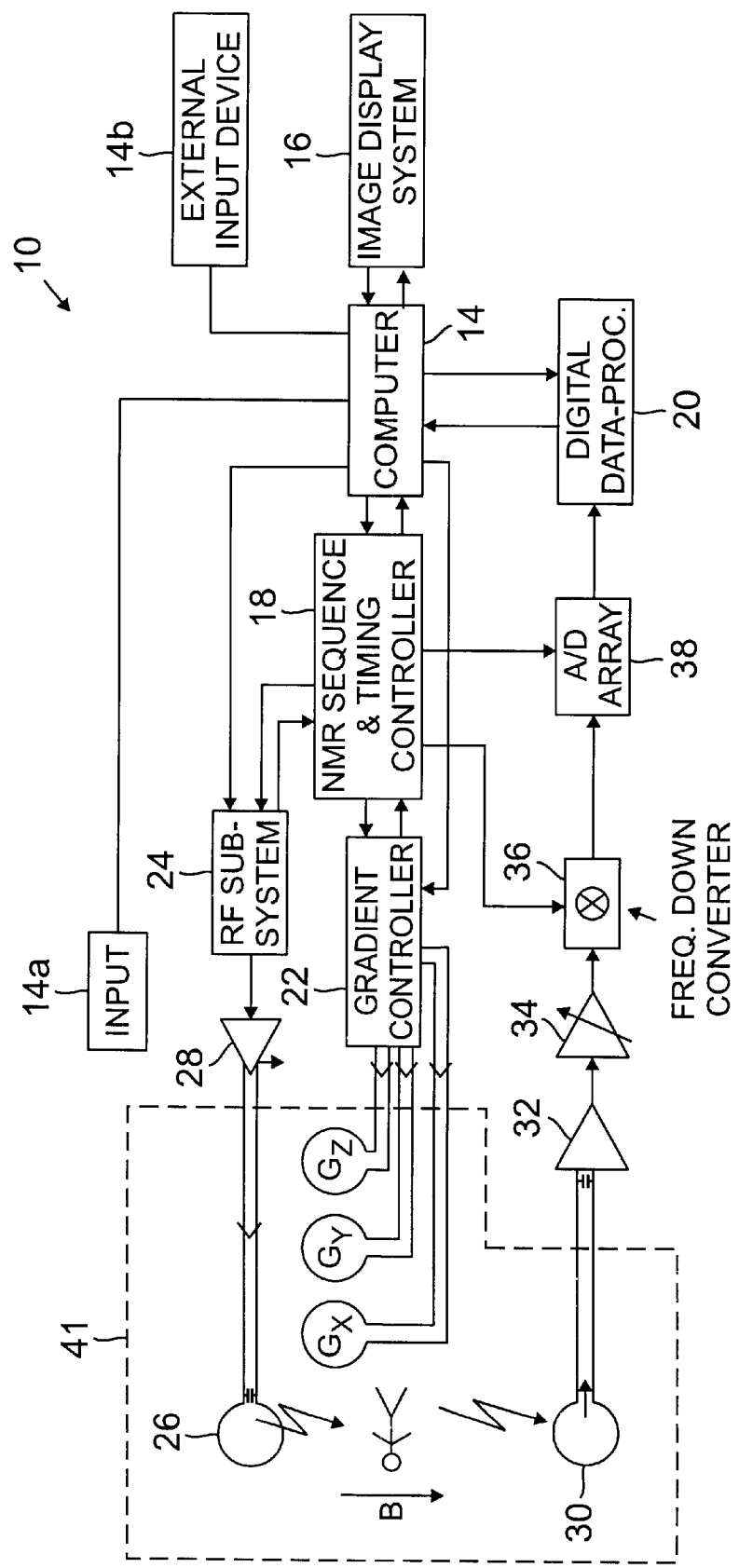
FIG. 1 is a schematic representation of a magnetic resonance imaging ("MRI") system in accordance with the present invention.

FIG. 1 is a schematic representation of an exemplary MRI system 10 including a computer 14, an image display system 16, a nuclear magnetic resonance sequence and timing controller ("NMR controller") 18 and a digital data processor 20. The system also includes a gradient controller 22 and a radio frequency transmitter subsystem ("RF subsystem") 24. The RF subsystem 24 includes a transmitting coil 26 coupled to an amplifier 28.

A receiving coil 30 is also provided, coupled to the digital data processor through a pre-amplifier 32, a variable amplifier 34, a frequency divider or frequency down converter 36 and an analog-to-digital conversion array ("A/D array") 38. The digital data processor 20 is typically coupled to the A/D array 38 through a data bus (not shown). While two separate transmitting and receiving coils 26, 30 are shown, a single coil can both transmit a radio frequency pulse and receive MR signals, as is known in the art.

The MRI system 10 includes an imaging volume 41 with a magnet (not shown). The transmitting coil 26, receiving coil 30 and gradient coils, Gx, Gy, Gz are within the imaging volume 41. Shim coils (not shown), are provided adjacent the poles of the magnet within the imaging volume 41, as is known in the art.

The computer 14 is a real time computer with submicrosecond timing precision. The computer 14 controls the overall operation of the MRI system 10. The computer 14 has outputs connected to inputs of the image display system 16, NMR controller 18, digital data processor 20, gradient controller 22, and RF subsystem 24. The computer 14 also has inputs connected to outputs of the image display system 16, NMR controller 18, and digital data processor 20. Predetermined pulse sequences are stored in the computer 14. Different scanning procedures may be provided for different body regions. The computer 14 provides the pulse sequence selected by the operator to the NMR controller 18 for execution.

The NMR controller 18 is a microprocessor based timing controller or other programmable device which stores the pulse sequence provided by the computer 14. A clock (not shown) in the NMR controller 18 synchronizes the entire MRI system 10. The NMR controller 18 has outputs connected to inputs of the gradient controller 22 and RF subsystem 24. The NMR controller 18 also has outputs connected to inputs of the frequency down converter 36 and A/D array 38. The NMR controller 18 has inputs connected to outputs of the gradient controller 22 and RF subsystem 24. The NMR controller 18 may be part of the computer 14.

The gradient controller 22 is a microprocessor, such as a digital signal processor (DSP), which includes a gradient waveform generator (not shown). The gradient controller 22 is connected to gradient coils Gx, Gy, Gz which generate orthogonal linear magnetic fields within the imaging volume along the x-y-z axis, respectively, under the control of the gradient controller 22. The gradient waveform generator contains a generic waveform stored in digital form and a phase encoding waveform. The magnitudes and directions of the gradient fields to be generated by each coil Gx, Gy, Gz during a particular pulse sequence are provided by the computer 14 to the gradient controller 22, which stores the information. The NMR controller 18 controls the timing of the operation of the gradient controller 22. In response to a pulse or pulses from the NMR controller 18, the gradient controller 22 causes the output of a particular waveform or waveforms for a desired pulse sequence to each of the gradient coils Gx, Gy, Gz, as is known in the art.

When instructed by the computer 14, the NMR controller 18 executes the pulse sequence provided by the computer 14 by providing a synchronization pulse, indicating the start of a scanning procedure, and timing pulses for controlling the operation of the various subsystems, to the A/D array 38, RF subsystem 24 and the gradient controller 22. For example, the NMR controller 18 provides a series of pulses to the A/D array 38 indicating when the A/D array 38 should sample the signal provided by the frequency down converter 36. The NMR controller 18 similarly provides a series of pulses to the RF transmitter subsystem 24 for initiating the injection of radio-frequency pulses of particular values, as determined by the pulse sequence, into the imaging volume. The NMR controller 18 also controls operation of the gradient controller 22, indicating when the gradient fields should be turned on and off. In this way, the NMR controller 18 and the computer 14 control the execution of a pulse sequence and the implementation of the MR scanning procedure.

The magnet of the MRI system 10 is preferably in an open configuration, enabling access to the patient by medical personnel to perform a medical procedure, such as surgery. Ser. No. 08/975,913, entitled "MRI Apparatus", filed on Nov. 21, 1997 by Gordon Danby, John Linardos, Jevan Damadian and Raymond V. Damadian, assigned to the assignee of the present invention and incorporated by reference herein, discloses an MRI system wherein a surgical procedure may be performed within the imaging volume of the system. The system disclosed can encompass part of or an entire room. U.S. Ser. No. 07/993,072, filed on Dec. 18, 1992, assigned to the assignee of the present invention and incorporated by reference herein, also discloses open MRI systems appropriate for conducting surgical procedures. The Quad 7000 and Quad 12000, available from FONAR Corporation, Melville, N.Y., are open MRI systems which can also be used in conjunction with medical procedures including surgery.

In accordance with the present invention, an input device 14a coupled to the computer 14 is provided proximate to or within the imaging volume 41. A doctor, such as a surgeon, or other personnel participating in a medical procedure, may thereby locally control the MRI system 10 based on the progress and needs of the procedure. The input device 14a is preferably a compact input device which can be operated by one hand, such as a mouse. Other possible input devices include a joystick with buttons, a track ball, a touchpad, a keypad, or any other easily manipulated hand-controlled devices. An external device 14b is also preferably provided for a scanning technologist in another room, so that control of the MRI system 10 can be passed to a scanning technologist, if necessary. The input device 14a may be coupled to the computer by being directly connected to the computer 14 through a wire 53. Alternating or direct current signals may be provided from the input device 14a to the computer 14 along the wire 53. The input device 14a can also be coupled to the computer 14 through a transmitter (not shown) on the input device which can transmit radio-frequency signals to a receiver (not shown) coupled to the computer 14. The input device 14a can also be a microphone and the MRI system can be controlled through voice-activation.

Figure 2:
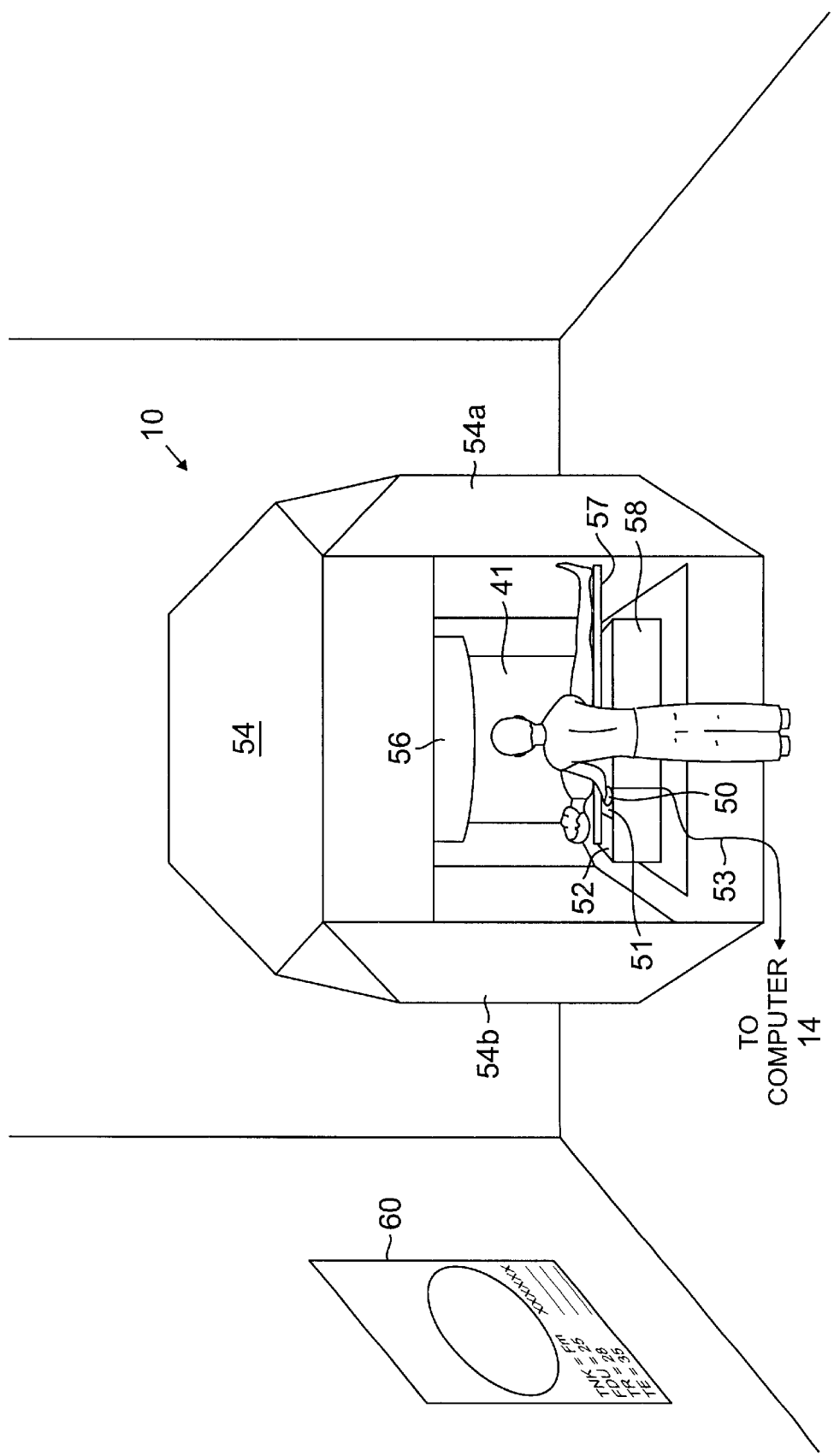
FIG. 2 is a view of a surgeon performing a procedure on a patient within an imaging volume of an MRI system, in accordance with the present invention.

FIG. 2 is a view of a surgeon in an operating room wherein the patient is within the imaging volume 41 of a magnet 54 of an open MRJ system 10. The imaging volume 41 is large enough for the surgeon to have sufficient access to the patient supported on a surface, bed 57, such as a within the imaging volume to conduct a surgical procedure. The surgeon is shown manipulating a mouse 50 on a mouse pad 51, supported by a table 52 next to the surgeon and patient, so that the surgeon or other medical personnel can control the parameters of the pulse sequences of the MRI scans conducted during the surgery, or other such medical procedure, in accordance with the present invention.

The magnet 54 of the MRI system 10 is in an open configuration. A frame of ferromagnetic material, typically of iron, supports magnetic poles 56, 58. The frame includes four side columns, two of which (54a, 54b) are shown in FIG. 2, providing significant open spaces enabling medical personnel, such as the surgeon, to have access to the patient. A screen 60 is preferably provided for the projection of the current MR image, as well as for displaying the current parameters of the scan and characteristics of the image, as described further, below. Alternatively, a monitor or super VGA glasses may be used to display the image, as indicated in FIG. 3.

While a surgeon will be referred to hereinafter, it is understood that other medical personnel within the operating room may operate the mouse 50. The present invention may also be useful outside of the context of performing surgery or other medical procedures while conducting the MRI procedure, wherever it would be desirable to rapidly input or vary the parameters of the pulse sequence.

Figure 3:
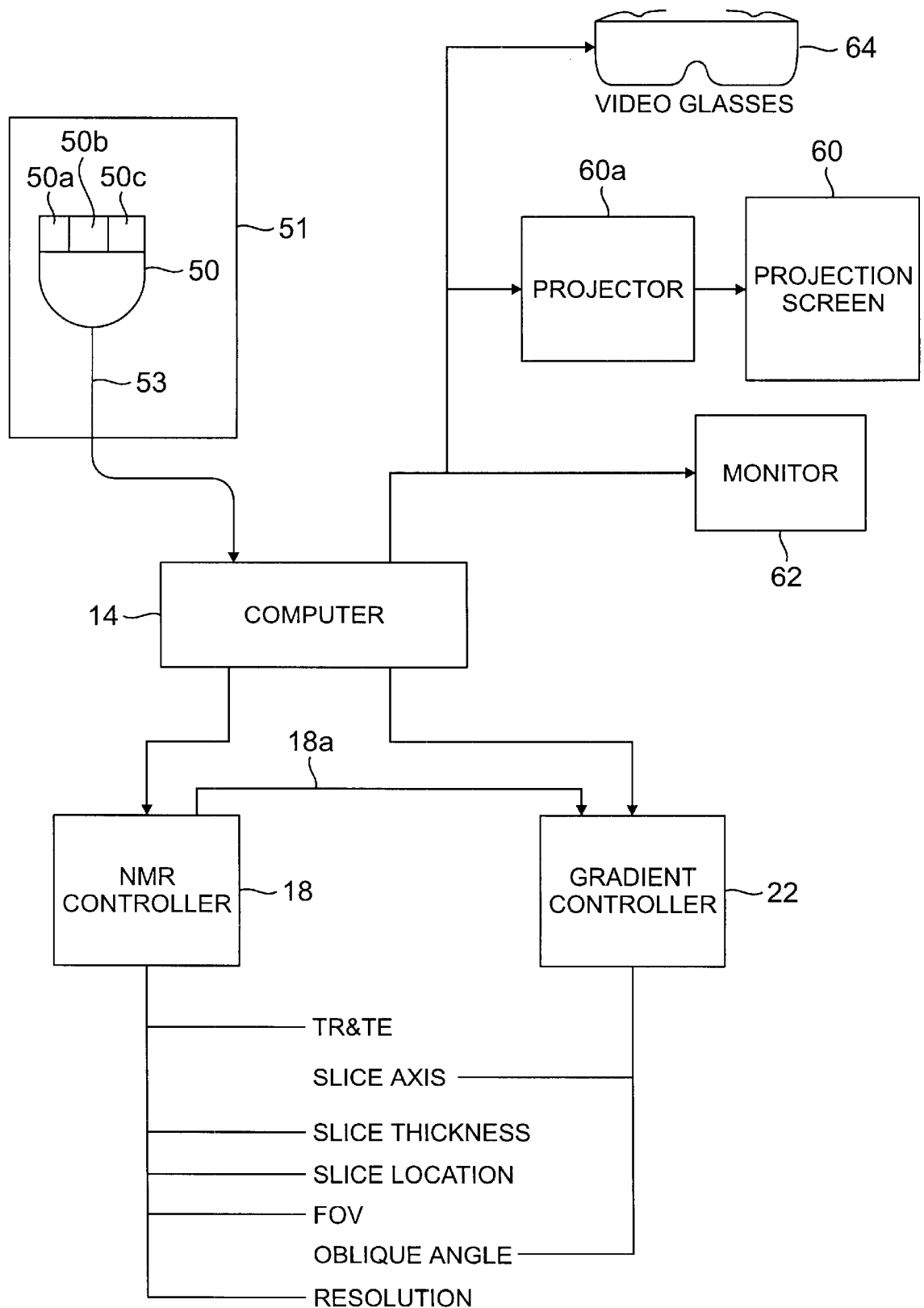
FIG. 3 is a schematic and functional representation of particular components of the MRI system in accordance with a preferred embodiment of the present invention.

FIG. 3 is a functional block diagram of the portions of the MRI system of FIG. 1 controlled by the system and method of a preferred embodiment of the present invention. A mouse 50 on a mouse pad 51 is connected to the computer 14 via the wire 53. The image display system 16 (FIG. 1) can be the screen 60 and projector 60a, a monitor 62, and/or the video glasses 64.

In the preferred embodiment the parameters of the pulse sequence defining the TE and TR values, the slice axis, the slice thickness, the slice location, the field of view ("FOV"), the oblique angle and the resolution of at least one of the resulting images may be individually updated by a processor, such as the computer 14, in response to signals directly provided by the mouse 50, under the control of the surgeon. The updated pulse sequence is provided to a control means, such as the NMR controller 18, for storage and implementation. The processing and control functions may be combined, by combining the NMR controller 18 with the computer 14, as mentioned above. The magnitudes and the directions of the gradient fields in the updated sequence are provided by the computer 14 to another control means, such as the gradient controller 22, which stores the updated values and causes generation of the gradient fields. The timing of the operation of the gradient controller 22 is controlled by the NMR controller 18, as indicated by line 18a. The gradient controller 22 may also be part of the computer 14. In the preferred embodiment described herein, the NMR controller 18 directly controls the TR and TE times, the slice thickness, the slice location, the field of view and the resolution. The gradient controller 22 controls the orthogonal slice axis and the oblique angle. It is noted that while the slice thickness, the field of view and resolution are controlled by the NMR controller 18 in the preferred embodiment, the gradient controller 22 may also be used to vary these characteristics of the MR image along with or instead of the NMR controller 18.

Since the mouse 50 or other such control device is preferably compact, it necessarily has a limited number of mechanisms for the input of information. A typical mouse is shown in FIG. 3, with three displaceable sections, such as clickable buttons 50a, 50b, 50c, and a rollerball (not shown). To increase the functionality of the input device 14a that it can control the designed numbers of parameters, the computer 14 is preferably programmed such that certain signals provided by the mouse 50 put the computer into different modes of operation. Subsequent signals provided by the mouse 50 to the computer 14 are then interpreted by the computer 14 to require update of the values of different parameters of the pulse sequence, dependent upon the current mode. For example, clicking one of the three clickable buttons 50a, 50b, 50c of the mouse 50, designates one of three different modes.

In one mode, which can be entered by double clicking any of the buttons, the TR and TE times, and the direction of the slice axis (sagittal, axial or coronal), are controlled. Preferably, this mode, referred to as the Sequence Control Mode ("SCM"), is entered by double clicking the left button 50a, shown in FIG. 3. In a second mode, which can be entered by double clicking either of the remaining buttons, the position and thickness of the slice and the field of view are controlled. Preferably, this mode, referred to as the Slice Positioning Mode ("SPM"), is entered by double clicking the center button 50b. In a third mode, which can be entered by double clicking the remaining button, the angle of the image slice and the resolution are controlled. Preferably, this mode, referred to as the Oblique Angle Mode ("OAM"), is entered by double clicking the right button 50c.

The Sequence Control Mode ("SCM")

In SCM, the values of the TR and TE parameters of the relaxation time are changed by moving the mouse 50 across the mouse pad 51. In a preferred configuration, movement with respect to the x-axis of the mouse pad 51 increases the TR value while movement with respect to the y-axis increases the TE value. The values of the TR and TE parameters can be changed simultaneously by movement with respect to both axis.

Figure 4A:
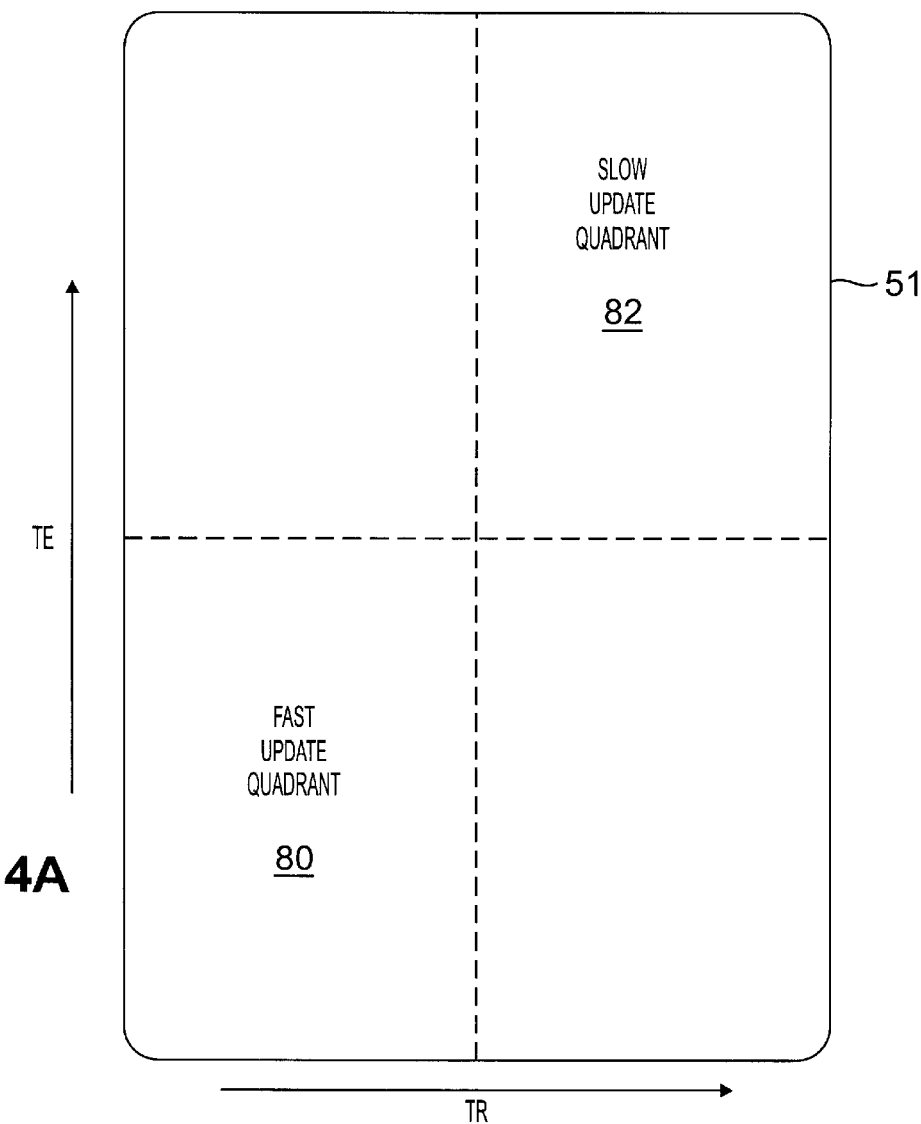
FIG. 4A is a top view of a mouse pad, showing the correlation between the position of a mouse on the mouse pad and TR and TE times in a first mode of the preferred embodiment of the present invention.
Figure 4B:
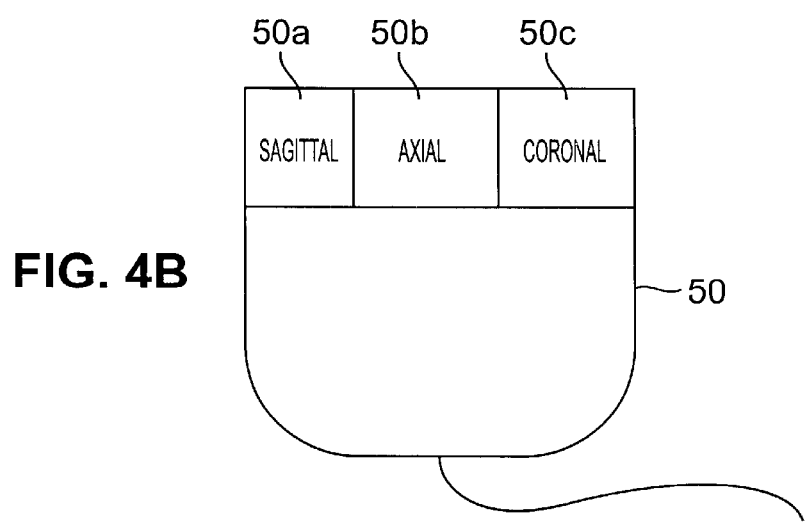
FIG. 4B is a schematic view of a mouse, indicating how the slice axis can be varied by the mouse buttons in the first mode of the preferred embodiment of the invention.

Movement of the mouse 50 can be correlated to TR and TE times by the position of a pointer on a display. The display can be an image projected on a screen, a monitor or super VGA glasses, as discussed further, below. FIG. 4A is an example of a grid 51 which can be provided on the display to aid in correlating the position of the pointer with TR and TE times. The grid is divided into four quadrants which give qualitative indications of the combinations of TR and TE times within that quadrant. The lower left quadrant, which includes relatively short TR and TE times, is a Fast Update Quadrant 80. TR times in the Fast Update Quadrant 80 can range from about 5 milliseconds to about 500 milliseconds, for example. TE times in the Fast Update Quadrant 80 can vary from about 1 millisecond to about 30 milliseconds, for example. MR scans conducted in the Fast Update Quadrant 80 can yield images in seconds.

TR times in the Slow Update Quadrant 82 can range from about 500 milliseconds to about 3 seconds. TE times in the Slow Update Quadrant 82 can range from about 30 milliseconds to about 150 milliseconds. MR scans conducted in the Slow Update Quadrant can take up to about twenty minutes to complete.

TR and TE times in the range of the Fast Update Quadrant 80 are generally preferred for providing images with sharp anatomical detail, as is known in the art. Such images, however, have reduced signal-to-noise ratio as compared with images taken at TR and TE times in the range of the Slow Update Quadrant 82. It is also known in the art that TR and TE times in the range of the Slow Update Quadrant 82 provide higher contrast between normal and diseased tissue. They may, therefore, be preferred for the diagnosis of diseased tissue, such as tumors.

Rotation of the ball on the underside of the mouse 50 as the mouse 50 is moved across the mouse pad increments or decrements the TR and TE times, as determined by the computer 14 under software control. When the mouse 50 becomes stationary in a new position for a set amount of time, such as 500 milliseconds, for example, the computer 14 will interrupt the current MR scanning procedure, update the pulse sequence by incorporating the new TR and/or TE times corresponding to the new position of the pointer on the display and begin a new scanning procedure. Any desired combination of TR and TE times within the operating range of the system can be chosen by movement of the mouse 50 to the appropriate location within the grid 51 of the display. The selected TR and TE times are also preferably displayed on the screen 60, or other such display.

The range of times corresponding to movement of the mouse 50 may be established in a set up mode prior to commencement of the procedure or may be programmed in the computer 14.

Instead of being provided on the display, the grid 51 may be the mouse pad itself. Movement of the mouse to particular positions on the mouse pad may be correlated to particular TR and TE times. If the mouse pad is 10 inches×10 inches, for example, each inch of movement along the x-axis may change the TR time by about 300 milliseconds. Each inch of movement along the y-axis may change the TE time by about 15 milliseconds. The change in TR and TE times with movement of the mouse 50 can vary in small or large increments. The length of the time increments may be established in the set up mode prior to conducting the procedure. A variable increment may also be established in the set up mode. For example, the time increments can be longer in the Slow Update Quadrant 82.

One surgical procedure which would be particularly benefitted by MRI conducted under the control of a surgeon in accordance with the present invention is the removal of a tumor. The present invention enables a surgeon to approach and monitor work at the site of the tumor while continuously conducting MRI in the Fast Update Quadrant 80, to quickly obtain images with sharp anatomical detail. After removal of the tumor, the surgeon can easily conduct MRI at TR and TE times in the Slow Update Quadrant 82 by moving the mouse into the upper right quadrant, to determine if any tumorous tissue remains at the site.

The slice axis can also be varied in the SCM mode between the sagittal, axial and coronal axis by a single click of the first, second, and third buttons 50a, 50b, 50c, of the mouse 50, respectively. Upon a single click of the desired button, the computer 14 provides an output to the gradient controller 22 to switch the slice select gradient into alignment with the desired axis. A new scanning procedure begins in the chosen orientation and continues until it is interrupted. The correspondence between the buttons on the mouse and the slice axis is exemplary. Different buttons can designate different axis.

Slice Positioning Mode ("SPM")

Figure 5A:
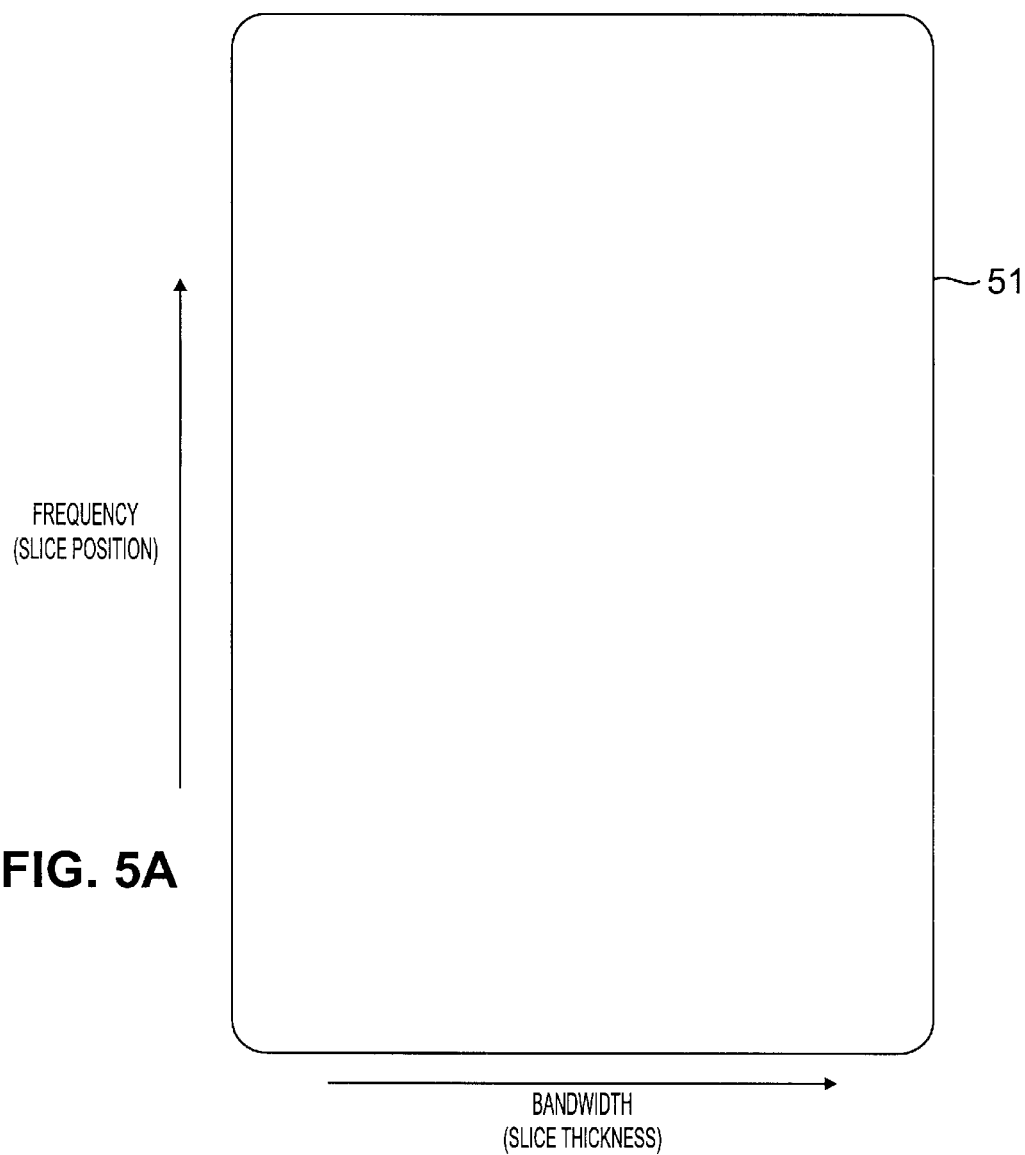
FIG. 5A is a view of the mouse pad indicating the variation of slice thickness and slice position in a second mode in accordance with the preferred embodiment of the present invention.
Figure 5B:
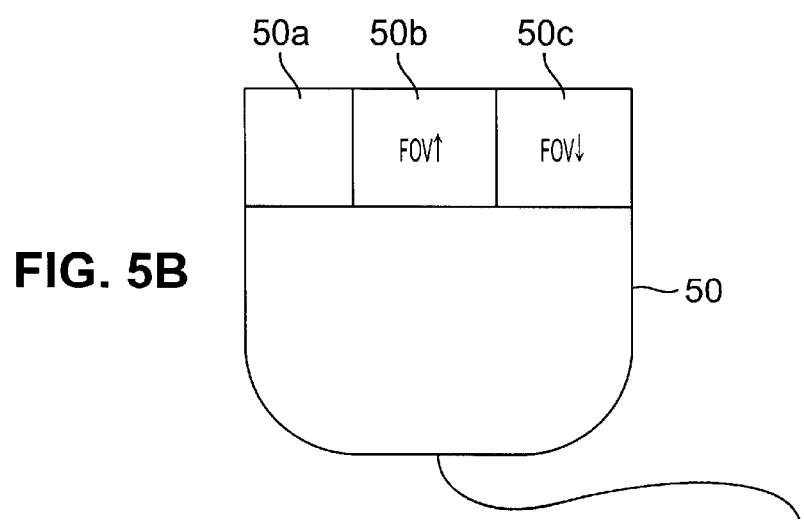
FIG. 5B is a schematic view of the mouse indicating how the field of view of the image can be controlled by two control buttons of the mouse in the second mode in accordance with the preferred embodiment of the present invention.
Figure 6:
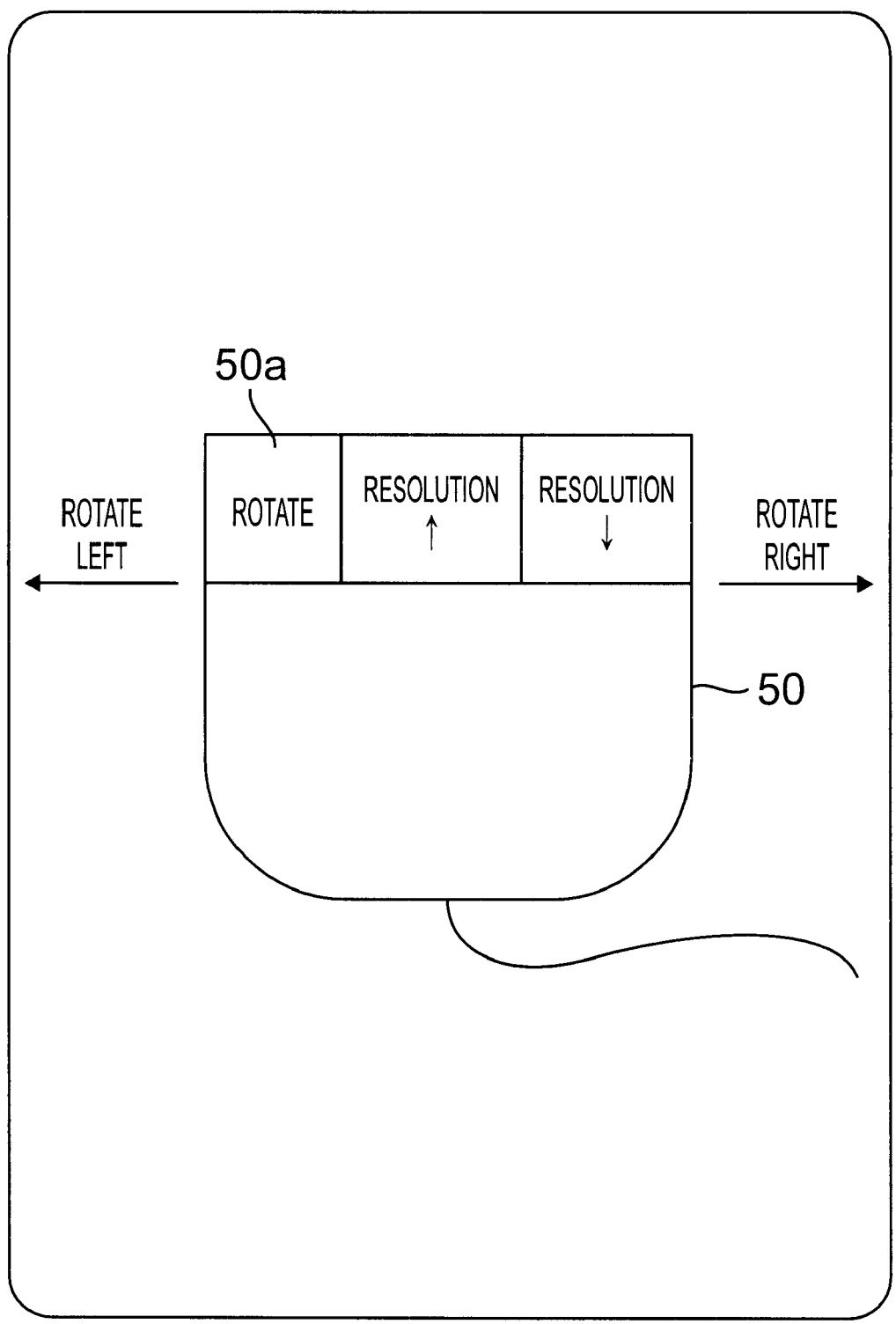
FIG. 6 is a view of the mouse on the mouse pad, indicating the control of the oblique angle of the slice and resolution of the image, in a third mode in accordance with the preferred embodiment of the present invention.

In this embodiment, the mouse 50 can cause the computer 14 to enter SPM to control the thickness, location and field of view of the image slice by double clicking on the second mouse button 50b. In the preferred embodiment, slice thickness can be varied by changing the bandwidth of the radio frequency pulse, as is known in the art. In SPM, the x-axis of the mouse pad 51 corresponds to the bandwidth, and hence thickness of the MRI slice, which increases from left to right, as shown in FIG. 5A. Movement along the x-axis can increment the slice thickness from about 0.5 mm to 10 mm, for example, by varying the radio frequency bandwidth. The particular increments of change of thickness with movement of the mouse 50 can be established in the set up mode. The preferred range of thickness variation depends on the body part, and may be limited by the capabilities of the MRI system 10, itself.

As above, when the mouse is stationary in a new position on the mouse pad 51 in SCM for about 500 milliseconds, the computer 14 updates the pulse sequence to appropriately vary the bandwidth in the pulse sequence. The updated pulse sequence is provided to the NMR controller 18 which controls the bandwidth of the radio frequency pulses emitted by the radio frequency antenna 28 and the timing of the pulses.

As is known in the art, thickness of an MR image slice can also be varied by changing the magnitude of the slice select gradient field. While not preferred, the computer 14 may be programmed to vary the slice thickness by changing the magnitude of the slice select gradient field instead of or along with changing the bandwidth.

In the preferred embodiment, the location of the slice is a function of the center frequency of the radio frequency pulse. In this configuration, the y-axis preferably corresponds to the frequency of the radio frequency pulse, which increases from the bottom to the top, also shown in FIG. 5A. Vertical movement of the mouse 50 changes the frequency, thereby shifting the location of the slice. The computer 14 updates the center frequency of the radio frequency pulses of the pulse sequence in response to the input provided by the mouse 50, based on its change in position. The new pulse sequence is provided to the NMR controller 18, which controls operation of the RF subsystem 24.

While not preferred, the computer 14 may also be programmed to change the magnitude of the gradient fields in conjunction with or instead of changing the radio frequency pulse, to vary slice position, if desired.

In SCM, any of the mouse buttons 50a, 50b, 50c can be used to increment and decrement the field of view, respectively. For example, single clicks on the second button 50b can increase the field of view while single clicks on the third button 50c can decrease the field of view. In the preferred embodiment, the field of view is changed by varying the sampling period of the A/D array 38 by the NMR controller 18. As above, the computer 14 updates the pulse sequence to change the values of the parameters to define the new field of view and provides the sequence to the NMR controller 18. The desired range of the field of view depends on the body part. The field of view can be increased or decreased at set intervals from about 5 cm to about 50 cm per click, which may also be determined in the set up mode.

Alternatively, the system can be set up so that holding one or the other button continuously increases or decreases the field of view at a predetermined rate, until the button is released. Double-clicking the first mouse button 50a returns to the MRI system 10 to SCM.

The computer 14 may also be programmed to change the magnitude of the gradient fields, if desired, instead of or along with changing the sampling period, to change the field of view.

Oblique Angle Mode ("OAM")

To adjust the oblique angle of the MRI scan, OAM may be entered by double clicking the third mouse button 50c. The current orientation of the slice is preferably displayed on the screen 60, monitor 62 or glasses 64 by a slice cursor, for example. One of the three mouse buttons, such as the first button 50a, is designated the Rotate button. Pressing and holding this button causes rotation of the slice cursor. When the mouse 50 is moved to the right or to the left on the mouse pad 51, the cursor rotates right or left, respectively. Preferably, the angle of the image is not updated until the rotate button 50a is released. The angle of image acquisition can be varied by suitably controlling the gradient magnetic fields to define a gradient plane of constant magnetic field at the desired angle, as is known in the art. The computer 14 provides the updated values for the gradient fields to the gradient controller 22 for the desired angle and the updated pulse sequence to the NMR controller 18, based on the input by the mouse 50.

The oblique angle of the MRI scan can also be changed by clicking on and dragging an end of the slice cursor to the desired orientation. A small window may be provided on the display to contain the slice cursor.

Since two buttons are unused in this mode, there is room for providing additional functionality. For example, the second and third buttons 50b, 50c, can be used to increase and decrease the resolution, respectively. In this embodiment, the resolution is varied by varying the sample period and sample frequency, as is known in the art. The sample frequency is the number of samples taken within the sample period. The NMR controller 18 controls the sample period and sample frequency through its control of the A/D array 38, as is known in the art. The resolution can be increased and decreased in set intervals per click or continuously while the button is held down, as desired and established in the set up mode.

Either SCM or SPM can be entered from OAM by double clicking the first or second control buttons 50a, 50b, respectively.

Preferably, the MRI system 10 continuously conducts a scanning loop to generate images at an initial pulse sequence, which may be established in the set up mode. The initial pulse sequence is preferably one in which the images are generated in a short period of time with rapid imaging techniques. Rapid imaging techniques enable the acquisition of multiple image slices in less than a minute and as fast as one second or less, as is known in the art. See, for example, Werhli, Felix, *Fast Scan Magnetic Resonance—Principles and Applications,* Raven Press, New York, N.Y. (1991), which is incorporated by reference, herein. The displayed images are, therefore, performed in realtime or nearly in real-time, dependent upon the selected TR times.

To change a particular parameter of the pulse sequence in accordance with the preferred embodiment, the surgeon double clicks an appropriate button to enter the mode controlling that parameter. Moving the mouse 50 to a new position on the mouse pad 51 corresponding to the desired parameters and maintaining the mouse 50 at the new position for a sufficient period of time, such as 500 milliseconds, or single clicking a control button corresponding to the desired parameter causes the computer to create a new, updated pulse sequence based on the pulse sequence currently being executed, and having at least one value of a parameter changed in accordance with the input provided by the surgeon. The updated pulse sequence, including the values of the updated parameters, is then provided to the NMR controller 14 and the values of the particular parameters determining the magnitudes and directions of the gradient fields generated during the pulse sequence may be provided to the gradient controller 22 in the same manner that a standard, predetermined pulse sequence and corresponding gradient field values are provided to the NMR controller 14 and gradient controller 22, respectively. The computer 14 then interrupts execution of the current pulse sequence and causes the NMR controller 14 to execute the updated pulse sequence, implementing the new scanning procedure, immediately or nearly immediately after the prior scanning sequence is ended.

An updated pulse sequence can thereby be formed and images obtained in accordance with the updated pulse sequence in real-time or nearly real-time. Since the updated pulse sequence is being formed while the current pulse sequence is being implemented, there is no delay between implementation of the current scanning procedure and the scanning procedure based on the updated pulse sequence. Scanning in accordance with each pulse sequence can therefore proceed continuously.

Alternatively, implementation of the scanning procedure in accordance with the updated pulse sequence can commence immediately after the prior scanning sequence is completed or when a new image is desired.

The computer 14 provides outputs to a projector 60a for projecting MRI images onto the projection screen 10. (See FIG. 3). The projector may be a multi-media projector, such as the Model 4802 from BOXLIGHT™ Corporation, Poulsbo, Wash., for example. As discussed above, the display may also be the monitor 62 and/or the video glasses 64. A Status List indicating the current parameters of the imaging procedure is preferably provided on the display, as well. The Status List preferably includes the following:

Present Mode
TE, TR
Field of View (FOV)
Sagittal, Axial or Coronal Plane Orientation
Oblique Angle Plane Orientation
Resolution
ScanTime Scan time is based on the selected TR time, as well as the number of repetitions and the number of levels of the scan.

The number of repetitions and levels of the scan are pulse sequence parameters which preferably are not controlled by the surgeon. If desired, however, such parameters may be controlled in accordance with the present invention, as well. Any other parameters of the sequence under the control of the surgeon, or other useful information, may be displayed as well.

Preferably, if scanning time would exceed some preset time interval, such as 30 seconds, for example, the surgeon would have to consent for the scan to commence, by double clicking the first button 50a while in SCM, for example. This enables the surgeon to choose a shorter scanning time by decreasing the TR time, if desired. The time interval for this feature could also be established in the set up mode.

The computer 14 or other such control device may be readily programmed to respond to the input of the input device 50 and form an updated pulse sequence in accordance with the present invention. In each of the modes, when changing a characteristic by moving the mouse 50 to cause rotation of the ball, the input to the control device may be based on the degree of rotation of the ball. A look up table may be used to correlate the movement of the mouse with updated parameter values. The program may be stored in any appropriate memory, such as a hard drive, read only memory, CD ROM or a disk.

Since the medical procedure is being conducted within the imaging volume 41 of the MRI system, the mouse 50 or other such input device should be substantially of non-ferromagnetic material. While a typical mouse 50 includes some metallic parts, they are so small that they are not expected to interfere with the imaging procedure, even if the mouse is within the imaging volume 41. The mouse 50 may be shielded, if necessary. Other sections of the MRI system which include ferromagnetic components, such as the control and processing units, may be provided outside of the room or may be shielded, as well.

Use of the mouse 50 is preferred because it offers sufficient input mechanisms to enable the control of all the parameters in the preferred embodiment in conjunction with the use of multiple modes of operation. A mouse is also an inexpensive, off the shelf item which is readily replaced if damaged. Since many doctors already have experience manipulating a mouse with their own personal computer, it will be easy for them to learn to use the mouse 50 to control the parameters of the MRI system 10 in accordance with the present invention. A joystick with buttons, a track ball, a touchpad, or any other easily manipulated hand-controlled device may also be used. A voice activation system can also be used, by the incorporation of commercially available software. In such case, the input device 14a would be a microphone coupled to the computer 14. With voice activation, the parameters can be directly changed without entering different modes of operation, if desired.

The optional set up mode for establishing the size of increments and the like can be entered and the values set on the scanning technologist's console. The mouse 50 could also be used to click on values on a set up menu itemizing the above described options.

The system and method of the present invention enable the generation of MRI images very quickly, i.e., in about 1 second or less, depending on the selected parameters. Interruption of a scanning sequence by the input of new values of parameters or the indication of a change of parameter values through a compact input device which can be operated by a single hand in the operating room in accordance with the present invention enables the rapid adjustment of a pulse sequence and initiation of a new scanning sequence.

The invention obviates the need for the surgeon to communicate with the technologist, who must then set up the new scanning sequence. The surgeon can thereby directly and immediately optimize the parameters of the pulse sequence to obtain the necessary image, based on the progress of the surgery or other such medical procedure.

While a value for one parameter of the pulse sequence for each characteristic of the image is described above, a characteristic may be determined by the values of multiple parameters, as is known in the art. For example, to change the oblique angle of the image, the magnitudes of at least two orthogonal gradient fields are changed. While this would require changing the values of the parameters of the pulse sequence corresponding to each of the gradient fields, the computer may be suitably programmed to change the values of the appropriate parameters based on the single input.

The preferred correspondence between the operating modes and the parameters controlled within the modes and the preferred correlation between particular control buttons or movements of the mouse with the modes or parameters described above may be varied as desired. The modes of operation themselves, while aiding in the organization of the parameters and increasing the functionality of the mouse or other such input device, are not required.

The input of the MRI system causing the change in the value of a parameter can also be provided through voice activation. The input can also be provided by clicking on suitable icons or arrows on the display. If the latter approach is used, providing a plurality of modes could also advantageously reduce the number of options which need to be displayed at one time.

While particularly suitable for use in conjunction with a medical procedure, such as a surgical procedure, taking place within the imaging volume of an MRI system, the method and apparatus of the present invention can be used wherever the rapid control and variation of individual parameters of a pulse sequence of an MRI procedure is desirable. For example, it could be advantageous under certain circumstances for the MR technologist to have the ability to rapidly change the parameters of the pulse sequence controlling the scanning procedure in real-time or nearly in real-time.

While a preferred embodiment is described above, one skilled in the art will recognize that variations may be introduced without going beyond the scope of the present invention, which is defined in the following claims.

We claim:

1. A method for changing parameters of a pulse sequence of a magnetic resonance imaging scan of a patient to change a characteristic of at least one image resulting from the scan, at least a portion of the patient being within an imaging volume of a magnetic resonance imaging system situated within a room, the method comprising:

providing an input device in the room, the input device being coupled to the magnetic resonance imaging system;

providing an input to the magnetic resonance-imaging system from the input device to cause a change in value of a parameter of the pulse sequence; and changing the value of a parameter of the pulse sequence in response to the input provided by the input device;

wherein the pulse sequence includes at least one parameter corresponding to the slice orientation of the at least one resulting image and the input device comprises three clickable buttons for changing the at least one parameter corresponding to the slice orientation of the at least one resulting image, one of said buttons corresponding to the sagittal, axial and coronal planes of the patient, respectively, the method comprising clicking one of the three buttons to cause a change in the value of the at least one parameter corresponding to the slice orientation.

2. A method for changing parameters of a pulse sequence of a magnetic resonance imaging scan of a patient to change a characteristic of at least one image resulting from the scan, at least a portion of the patient being within an imaging volume of a magnetic resonance imaging system situated within a room, the method comprising:

providing an input device in the room, the input device being coupled to the magnetic resonance imaging system;

providing an input to the magnetic resonance imaging system from the input device to cause a change in value of a parameter of the pulse sequence; and changing the value of a parameter of the pulse sequence in response to the input provided by the input device;

wherein the pulse sequence includes at least one parameter corresponding to the field of view of the at least one resulting image and the input device comprises at least two clickable buttons, the method comprising clicking one of the buttons to cause a change in the value of the at least one parameter corresponding to the field of view to increase the field of view and clicking another button to cause a change in the value of the at least one parameter corresponding to the field to view to decrease the field of view.

3. A method for changing parameters of a pulse sequence of a magnetic resonance imaging scan of a patient to change a characteristic of at least one image resulting from the scan, at least a portion of the patient being within an imaging volume of a magnetic resonance imaging system situated within a room, the method comprising:

providing an input device in the room, the input device being coupled to the magnetic resonance imaging system;

providing an input to the magnetic resonance imaging system from the input device to cause a change in value of a parameter of the pulse sequence; and changing the value of a parameter of the pulse sequence in response to the input provided by the input device;

wherein the pulse sequence includes at least one parameter corresponding to the oblique angle of the at least one resulting image with respect to the patient and the input device comprises a clickable button and a rolling portion, the method comprising clicking and releasing the button to provide a first input to the magnetic resonance imaging system to enter a mode of operation for changing the at least one parameter corresponding to the oblique angle and changing the value of the at least one parameter corresponding to the oblique angle of the resulting image after clicking and releasing the button by depressing the clickable button while moving the input device across a surface to the right to rotate the oblique angle of the at least one resulting image to the right and moving the input device to the left to rotate the oblique angle of the at least one resulting image to the left.

4. A method for changing parameters of a pulse sequence of a magnetic resonance imaging scan of a patient to change a characteristic of at least one image resulting from the scan, at least a portion of the patient being within an imaging volume of a magnetic resonance imaging system situated within a room, the method comprising:

providing an input device in the room, the input device being coupled to the magnetic resonance imaging system;

providing an input to the magnetic resonance imaging system from the input device to cause a change in value of a parameter of the pulse sequence; and changing the value of a parameter of the pulse sequence in response to the input provided by the input device;

wherein the pulse sequence includes at least one parameter corresponding to the resolution of the resulting image and the input device comprises at least two buttons, the method comprising changing the value of the at least one parameter corresponding to the resolution of the resulting image by clicking one button to increase the resolution and clicking another button to decrease the resolution.

5. A method for changing parameters of a pulse sequence of a magnetic resonance imaging scan of a patient to change a characteristic of at least one image resulting from the scan, at least a portion of the patient being within an imaging volume of a magnetic resonance imaging system situated within a room, the method comprising:

providing an input device in the room, the input device being coupled to the magnetic resonance imaging system;

providing an input to the magnetic resonance imaging system from the input device to cause a change in value of a parameter of the pulse sequence; and changing the value of a parameter of the pulse sequence in response to the input provided by the input device;

wherein the pulse sequence includes at least one parameter corresponding to TR time of the at least one resulting image and the input device comprises a rolling portion for being rolled as the input device is moved across a surface for causing a change in the value of the at least one parameter corresponding to TR time, the method comprising moving the input device across the surface to change the value of the at least one parameter corresponding to the TR time to change the TR time.

6. The method of claim 5, wherein the pulse sequence further includes at least one parameter corresponding to the TE time of the at least one resulting image, the method comprising moving the input device across the surface with respect to first and second orthogonal axes to change the TE and TR times, the degree of change being a function of the resultant movement with respect to each axis.

7. A method for changing parameters of a pulse sequence of a magnetic resonance imaging scan of a patient to change a characteristic of at least one image resulting from the scan, at least a portion of the patient being within an imaging volume of a magnetic resonance imaging system situated within a room, the method comprising:

providing an input device in the room, the input device being coupled to the magnetic resonance imaging system;

providing an input to the magnetic resonance imaging system from the input device to cause a change in value of a parameter of the pulse sequence; and changing the value of a parameter of the pulse sequence in response to the input provided by the input device;

wherein the pulse sequence includes at least one parameter corresponding to the TE time of the at least one resulting image and the input device comprises a rolling portion for being rolled as the input device is moved across a surface, the method comprising moving the input device across the surface to change the value of the at least one parameter corresponding to the TE time to change the TE time.

8. A method for changing parameters of a pulse sequence of a magnetic resonance imaging scan of a patient to change a characteristic of at least one image resulting from the scan, at least a portion of the patient being within an imaging volume of a magnetic resonance imaging system situated within a room, the method comprising:

providing an input device in the room, the input device being coupled to the magnetic resonance imaging system;

providing an input to the magnetic resonance imaging system from the input device to cause a change in value of a parameter of the pulse sequence; and changing the value of a parameter of the pulse sequence in response to the input provided by the input device;

wherein the pulse sequence includes at least one parameter corresponding to the slice thickness of the at least one resulting image and the input device comprises a rolling portion for being rolled as the input device is moved across a surface, the method comprising moving the input. device across the surface to change the value of the at least one parameter corresponding to slice thickness to change the slice thickness.

9. A method for changing parameters of a pulse sequence of a magnetic resonance imaging scan of a patient to change a characteristic of at least one image resulting from the scan, at least a portion of the patient being within an imaging volume of a magnetic resonance imaging system situated within a room, the method comprising:

providing an input device in the room, the input device being coupled to the magnetic resonance imaging system;

providing an input to the magnetic resonance imaging system from the input device to cause a change in value of a parameter of the pulse sequence; and changing the value of a parameter of the pulse sequence in response to the input provided by the input device;

wherein the pulse sequence includes at least one parameter corresponding to the slice position of the at least one resulting image and the input device comprises a rolling portion for being rolled as the input device is moved across a surface and a clickable portion, the method comprising depressing and releasing the clickable portion to select a mode of operation for changing the at least one parameter corresponding to slice position, depressing the clickable portion and moving the input device across the surface while depressing the clickable portion to change the value of the at least one parameter corresponding to slice position to change the slice position.

10. A method for changing parameters of a pulse sequence of a magnetic resonance imaging scan of a patient to change a characteristic of at least one image resulting from the scan, at least a portion of the patient being within an imaging volume of a magnetic resonance imaging system situated within a room, the method comprising:

providing an input device in the room, the input device being coupled to the magnetic resonance imaging system;

providing an input to the control device from the input device to cause a change in value of a parameter of the pulse sequence; and changing the value of a parameter of the pulse sequence corresponding to a characteristic of the at least one resulting image chosen from the group consisting of field of view, resolution, TR time TE time and slice thickness.

11. A method for changing values of parameters of a pulse sequence of a magnetic resonance imaging scan with an input device coupled to a magnetic resonance imaging system to change a characteristic of an image resulting from the scan and a display screen for displaying the image, wherein the pulse sequence comprises values of parameters corresponding to characteristics of at least one image resulting from the scan, the method comprising:

providing a pulse sequence;

providing an input device with a clickable button;

entering a first mode of operation of the system by clicking the button to provide a first input to the system through the input device for changing a value of at least one parameter of the pulse sequence, the first input being independent of a position of a cursor on the screen display; and changing the value of the at least one parameter by providing a second input to the system through the same input device while in the first mode.

12. The method of claim 11, wherein the input device further comprises a second button, the method further comprising:

entering a second mode of operation of the system by clicking the second button to provide a third input to the system through the input device for changing the value of at least one other parameter, the third input being independent of the position of a cursor on the screen; and changing the value of the at least one other parameter by providing a fourth input to the system through the input device while in the second mode.

13. The method of claim 12, wherein double clicking each button causes the system to enter a respective mode of operation and then single clicking a button varies a different parameter in each mode.

14. The method of claim 11, further comprising disposing the patient and the scanner of the magnetic resonance imaging system within a room and disposing the input device proximate the patient within the room.

15. The method of claim 11, further comprising providing a mouse with at least two clickable buttons and a rolling ball, as the input device, wherein clicking each button and moving the mouse changes a different parameter of the pulse sequence dependent upon the mode of operation.

16. The method of claim 11, wherein the input device further comprises a rolling portion for being rolled across a surface, the method comprising providing the second input by moving the input device across the surface.

17. A method of conducting magnetic resonance imaging on a patient in a room comprising:

implementing a first magnetic resonance imaging scanning sequence based on a first pulse sequence of a plurality of values of parameters corresponding to characteristics of a resulting image;

changing the value of at least one timing parameter of the first pulse sequence by a person in the room to form an updated pulse sequence; and implementing a second magnetic resonance imaging scanning sequence based on the updated pulse sequence.

18. The method of claim 17, further comprising changing the value of the at least one parameter by manipulating a hand-operated input device in the room.

19. The method of claim 17, further comprising changing the value of the at least one parameter through voice activation.

20. The method of claim 17, further comprising performing an operation on the patient while implementing the magnetic resonance imaging scanning sequence.

21. The method of claim 20, further comprising changing the value of the at least one parameter by a surgeon.

22. The method of claim 20, comprising implementing the first magnetic resonance imaging scanning sequence based on a first pulse sequence with parameters including values corresponding to TR times from about 5 milliseconds to about 500 milliseconds and TE times of from about 1 millisecond to about 30 milliseconds.

23. The method of claim 20, further comprising changing the parameters of the first pulse sequence corresponding to the TR time to between about 500 milliseconds to 3 seconds and changing the value of the parameter of the first pulse sequence corresponding to the TE time to between about 30 to about 150 milliseconds in the updated pulse sequence and conducting the second magnetic resonance imaging scanning sequence.

24. The method of claim 23, further comprising approaching the site of a tumor while implementing the magnetic resonance imaging scanning sequence based on the first pulse sequence and implementing a magnetic resonance imaging scanning sequence based on the updated pulse sequence at the site of the tumor.

25. The method of claim 17, comprising changing the value of the at least one timing parameter chosen from the group consisting of TR time and TE time in the first pulse sequence to change the timing parameter.

26. The method of claim 25, comprising changing the value of the at least one timing parameter by moving an input device with a rolling portion across a surface.

27. The method of claim 26, comprising moving the input device across a surface with respect to a grid.

28. The method of claim 27, comprising moving the input device across a surface with respect to a grid on a display screen.

29. The method of claim 27, comprising moving the input device across a surface with respect to a grid on the surface.

30. A system for conducting magnetic resonance imaging, comprising:
a primary field magnet assembly for being disposed within a room, the magnet assembly having an imaging volume;
a surface for supporting the patient such that at least a portion of the patient is within the imaging volume;
a radio-frequency transmitter for being positioned with respect to the imaging volume to transmit radio frequency signals to the portion of the patient within the imaging volume;
a radio-frequency receiver system for being positioned with respect to the portion of the patient within the imaging volume to receive magnetic resonance imaging signals from at least the portion of the patient within the imaging volume;
control and processing means for providing and executing a current pulse sequence comprising values of parameters corresponding to respective characteristics of a resulting magnetic resonance image; and
an input device for being coupled to the control and processing means to provide an input to said means indicative of a mode of operation and a change in the value of at least one parameter of the current pulse sequence,
the control and processing means being programmed to:
operate in a plurality of modes of operation, each mode for changing at least one parameter corresponding to at least one characteristic of an image;
change the value of at least one parameter corresponding to a first characteristic in response to a first input from the input device, while in a first mode;
change the value of at least one parameter corresponding to a second characteristic in response to a second input from the input device, while in the first mode;
change the value of at least one parameter corresponding to a third characteristic in response to a third input from the input device, while in a second mode; and
form an updated pulse sequence comprising the changed parameter values.

31. The system of claim 30, wherein the magnet assembly is an open configuration and the input device is proximate the patient.

32. The system of claim 31, wherein the input device provides signals to the processor to change the value of a parameter corresponding to a characteristic of the resulting image chosen from the group consisting of TR time, TE time, TE time, slice axis, slice thickness, slice location, field of view, oblique angle and resolution.

33. The system of claim 30, wherein the input device is a mouse.

34. The system of claim 33, wherein the mouse includes a plurality of buttons, a respective mode is selected by clicking and releasing a respective button and the value of at least one of the parameters is changed by clicking at least one of the buttons after selecting the respective mode.

35. The system of claim 34, wherein the processor includes a look up table of parameter values corresponding to the movement of the mouse.

36. The system of claim 35, wherein the display comprises a projector for projecting an image onto a screen or a wall of the room.

37. The system of claim 33, wherein the mouse further comprises a rolling portion and the control and processing means is programmed to change the value of at least one of the parameters in response to an input generated by moving the mouse over a surface to cause rolling of the rolling portion.

38. The system of claim 37, wherein the respective mode is selected by double-clicking the respective button.

39. The system of claim 30, wherein the input device is coupled to the controller by a wire.

40. The system of claim 30, wherein the input device is electromagnetically coupled to the controller.

41. The system of claim 30, further comprising a display for displaying the status of at least certain characteristics of the at least one resulting image.

42. The system of claim 41, wherein the display comprises a monitor.

43. The system of claim 41, wherein the display comprises video glasses.

44. The system of claim 30, wherein the input device is hand-operated.

45. The system of claim 30, wherein the control and processing means interrupts execution of the current pulse sequence when the updated pulse sequence is formed, and executes the updated pulse sequence immediately after the current pulse sequence is interrupted.

46. The system of claim 30, wherein the control and processing means is programmed to form the updated pulse sequence during execution of the current pulse sequence and to execute the updated pulse sequence after the updated pulse sequence is formed.

47. A system for conducting magnetic resonance imaging comprising:
- a primary field magnet assembly for being disposed within a room, the magnet assembly having an imaging volume;
- a surface for supporting the patient such that at least a portion of the patient is within the imaging volume;
- a radio-frequency transmitter for being positioned with respect to the imaging volume to transmit radio-frequency signals to the portion of the patient within the imaging volume;
- a radio-frequency receiver system for being positioned with respect to the portion of the patient within the imaging volume to receive magnetic resonance imaging signals from at least the portion of the patient within the imaging volume;
- control and processing means for providing and executing a pulse sequence comprising values of parameters corresponding to respective characteristics of a resulting magnetic resonance image;
- an input device coupled to the control and processing means, the input device comprising a plurality of clickable buttons, each for providing an input to said means indicative of a change in the value of at least one parameter of a current pulse sequence, the input device being disposed in the room containing the magnet assembly;
- the control and processing means being programmed to:
  - operate in a plurality of modes of operation, wherein in each mode, at least one respective parameter corresponding to at least one characteristic of an image may be changed;
  - enter a first mode of operation for changing the value of at least one parameter corresponding to a first characteristic, in response to a first input generated by clicking the first button of the input device;
  - enter a second mode of operation for changing the value of at least one parameter corresponding to a second characteristic, in response to a second input generated by clicking a second button of the input device;
  - change a respective characteristic in a respective mode in response to a third input from the input device; and
  - form an updated pulse sequence based on the changed parameter values.

48. The system of claim 47, wherein the control and processing means interrupts execution of the current pulse sequence when the updated pulse sequence is formed and executes the updated pulse sequence immediately after the current pulse sequence is interrupted.

49. The system of claim 47, wherein the control and processing means is further programmed to:
- enter a third mode of operation for changing the value of at least one parameter corresponding to a third characteristic in response to a third input generated by clicking a third button of the input device.

50. The system of claim 49, wherein the control and processing means is programmed to enter one of the first, second and third modes in response to double-clicking a respective one of the buttons.

51. The system of claim 47, wherein the input device further comprises a rolling portion for being rolled as the input device is moved over a surface, the third input being provided by moving the input device across the surface.

52. A method of conducting magnetic resonance imaging of a subject, at least a portion of the subject being within an imaging volume of a magnetic resonance imaging system situated within a room, the method comprising:
- providing an input device comprising first and second clickable buttons in the room, the input device being coupled to the magnetic resonance imaging system;
- conducting a magnetic resonance imaging scan of the patient based on a first pulse sequence to generate a first image;
- double-clicking one of the first and second clickable buttons to cause the magnetic resonance imaging system to enter one of a first mode of operation for changing at least one parameter of the pulse sequence corresponding to a first characteristic of the first image and for changing at least one parameter of the pulse sequence corresponding to a second characteristic of the first image, and a second mode of operation for changing at least one parameter of the pulse sequence corresponding to a third characteristic of the image;
- depressing and releasing one of the first and second clickable buttons to provide an input to the magnetic resonance imaging system while in the respective mode to cause a change in value of the least one parameter of the pulse sequence corresponding to a respective image characteristic to change the image characteristic;
- changing the value of the at least one parameter of the pulse sequence in response to the input and forming a second pulse sequence including the changed value; and
- conducting a magnetic resonance imaging scan of the subject based on the second pulse sequence to generate a second image.

53. The method of claim 52, wherein the input device comprises a third clickable button, the values of at least one parameter corresponding to a fourth image characteristic may be changed in the second mode, and double clicking the third clickable button causes the magnetic resonance imaging system to enter a third mode of operation for changing at least one parameter of the pulse sequence corresponding to a fifth image characteristic, the method comprising:
- double-clicking one of the first, second and third clickable buttons to cause the magnetic resonance imaging system to enter a respective mode of operation;
- depressing and releasing one of the first, second and third buttons while in a respective mode of operation to provide an input to the magnetic resonance imaging system to cause a change in value of respective parameters of the first pulse sequence to change a respective characteristic of the image.

54. The method of claim 52, wherein the input device further comprises a rolling portion for being rolled as the input device is moved across a surface, the method comprising:
- depressing and releasing one of the buttons or moving the input device across a surface while in a respective mode to provide an input to the magnetic resonance imaging system to cause a change in value of a the at least one parameter of the pulse sequence corresponding to a respective image characteristic to change the image characteristic.

55. The method of claim 52, wherein the input device further comprises a rolling portion for being rolled as the input device is moved across a surface, the method comprising:
- depressing one of the buttons and moving the input device across a surface while the button is depressed, while in a respective mode, to provide an input to the magnetic resonance imaging system to cause a change in value of the at least one parameter of the pulse sequence corresponding to a respective image to change the image characteristic.

56. A method of conducting a medical procedure, comprising:
    positioning a patient in an imaging volume of a magnetic resonance imaging system in a room;
    providing an input device in the room, the input device being coupled to the magnetic resonance system;
    conducting a medical procedure on the patient within the imaging volume;
    conducting a first magnetic resonance imaging scan of the patient based on a first pulse sequence;
    providing a signal from the input device to the magnetic resonance imaging system to change the value of at least one timing parameter of the first pulse sequence, to form a second pulse sequence; and
    conducting a second magnetic resonance imaging scan of the patient based on the second pulse sequence.

57. The method of 56, wherein the at least one timing parameter is chosen from the group consisting of TE time and TR time.

58. The method of claim 57, wherein the timing parameter comprises TR time and TE time, the value of the TR time in the first pulse sequence is from about 5 milliseconds to about 500 milliseconds and the value of the TE time is from about 1 millisecond to about 30 milliseconds.

59. The method of claim 58, comprising changing the value of the TR time in the second pulse sequence to between about 500 milliseconds to about 3 seconds and changing the value of TE time in the second pulse sequence to between about 30 milliseconds to about 150 milliseconds.

60. The method of claim 59, wherein the medical procedure is removal of a tumor, the method further comprising approaching the site of the tumor while conducting magnetic resonance imaging based on the first pulse sequence and conducting the second magnetic resonance imaging scan at the site of the tumor.

61. The method of claim 56, comprising continuously conducting the first magnetic resonance imaging scan based on the first pulse sequence until the second pulse sequence is changed and then continuously conducting the second magnetic resonance imaging scan based on the second pulse sequence.

62. The method of claim 56, wherein the input device comprises a rolling portion, the method comprising rolling the input device with respect to a surface to cause rolling of the rolling portion, the signal being dependent on the degree of rotation of the rolling portion.

63. A method for changing parameters of a pulse sequence, comprising:
    providing an input device coupled to the MRI system, the input device comprising first and second clickable buttons, wherein clicking and releasing the first clickable button causes the system to enter a first mode of operation for changing the value of at least one parameter corresponding to a first characteristic of an image and for changing the value of at least one parameter corresponding to a second characteristic of the image, and clicking and releasing the second button causes the system to enter a second mode of operation for changing the value of at least one parameter corresponding to at least one other characteristic of an image;
    the method further comprising clicking and releasing one of the first and second buttons to select one of the modes of operation; and
    clicking one of the first and second buttons after selecting one of the modes to change the value of at least one parameter corresponding to one of the characteristics of the pulse sequence.

64. The method of claim 63, comprising double-clicking one of the buttons to select one of the modes.

65. The method of claim 64, wherein clicking and releasing one of the first and second buttons after selecting one of the modes changes the value of the at least one parameter to change a characteristic of the image in a first direction and clicking and releasing the other of the first and second buttons changes the at least one parameter to change the characteristic in a second direction opposite the first direction.

66. The method of claim 64, wherein clicking and releasing one of the first and second buttons after selecting one of the modes changes the value of the at least one parameter to change a first characteristic of an image and clicking and releasing the other one of the first and second buttons changes the value of the at least one other parameter to change a second characteristic of the image.

67. The method of claim 63, wherein in the second mode, the value of parameters corresponding to at least two characteristics may be changed.

68. A method for changing parameters of a pulse sequence, comprising:
    providing an input device coupled to the MRI system, the input device comprising first and second clickable buttons, wherein clicking and releasing the first clickable button causes the system to enter a first mode of operation for changing the value of at least one parameter corresponding to a first characteristic of an image and for changing the value of at least one parameter corresponding to a second characteristic of the image and clicking and releasing the second button causes the system to enter a second mode of operation for changing the value of at least one parameter corresponding to a third characteristic of an image, and a rolling portion for being rolled as the input device is moved across a surface to cause a change in the value of at least one selected parameter;
    the method further comprising clicking and releasing one of the first and second buttons to select one of the modes of operation; and
    moving the input device across a surface to roll the rolling portion after selection of a mode to cause a change in the value of at least one parameter of the pulse sequence corresponding to one of the characteristics.

69. The method of claim 68, comprising double clicking one of the buttons to select one of the modes.

70. The method of claim 69, wherein the input device further comprises a third button and double clicking on the third button causes the system to enter a third mode of operation for changing at least one parameter corresponding to a fourth characteristic of the image.

71. The method of claim 68, comprising moving the input device in a first direction to cause a change in the value of the at least one parameter to change a first characteristic of an image in a first direction and moving the input device in a second direction to cause a change in value of the at least one parameter to change a second characteristic of the image in a second direction opposite the first direction.

72. The method of claim 71, comprising depressing a button while moving the input device.

73. The method of claim 71, wherein, when in one of the modes, moving the input device along a first axis changes the value of at least one parameter to change the slice position of the image and moving the input device along a second axis intersecting the first axis changes the value of at least one parameter to change the slice thickness of the image.

74. The method of claim 73, comprising depressing one of the buttons while moving the device.

75. The method of claim 68, wherein moving the input device and clicking on one of the buttons causes a change in respective parameters corresponding to respective characteristics, the method further comprising clicking on one of the buttons while in a mode to cause a change in the value of at least one parameter corresponding to another characteristic.

* * * * *